US005885889A

United States Patent [19]

Aisou

[11] Patent Number: 5,885,889

[45] Date of Patent: Mar. 23, 1999

[54] PROCESS OF FABRICATING SEMICONDUCTOR DEVICE HAVING DOPED POLYSILICON LAYER WITHOUT SEGREGATION OF DOPANT IMPURITY

[75] Inventor: Fumiki Aisou, Tokyo, Japan

[73] Assignee: NEC Corporation, Tokyo, Japan

[21] Appl. No.: 810,852

[22] Filed: Mar. 4, 1997

[51] Int. Cl.[6] .................................................. H01L 21/3205

[52] U.S. Cl. .......................... 438/592; 438/486; 438/657; 438/301

[58] Field of Search ..................................... 438/592, 486, 438/660, 166, 657, 684, 299, 301, 305

[56] References Cited

U.S. PATENT DOCUMENTS 5,081,066 1/1992 Kim ........................................ 438/453
5,155,051 10/1992 Noguchi .
5,242,855 9/1993 Oguro ..................................... 438/486
5,486,237 1/1996 Sano et al. .............................. 438/486
5,639,689 6/1997 Woo ........................................ 438/398

FOREIGN PATENT DOCUMENTS 0 051 249 5/1982 European Pat. Off. .

*Primary Examiner*—Michael Trinh
*Attorney, Agent, or Firm*—Foley & Lardner

[57] ABSTRACT

An intentionally undoped amorphous silicon layer, a phosphorous doped amorphous silicon layer and a tungsten silicide layer are successively laminated on a gate oxide layer, and are patterned into a gate electrode of a field effect transistor; while a phosphosilicate glass layer over the gate electrode is being reflowed, the amorphous silicon layers are crystallized to a polysilicon layer, and phosphorous is less segregated at the boundary between the gate oxide layer and the polysilicon layer during the heat treatment.

9 Claims, 19 Drawing Sheets

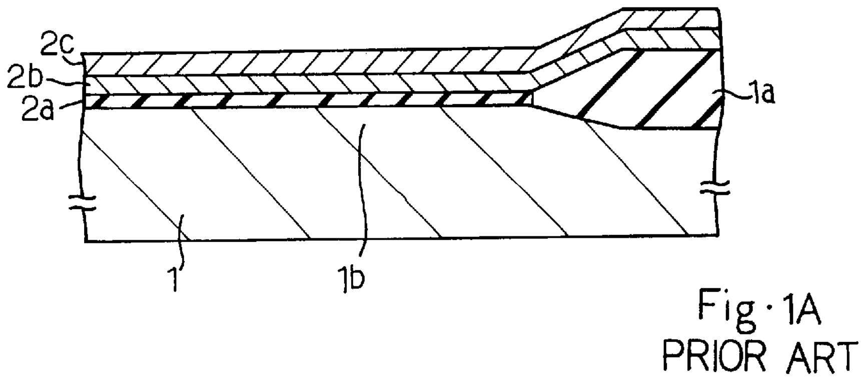
Fig·1A
PRIOR ART
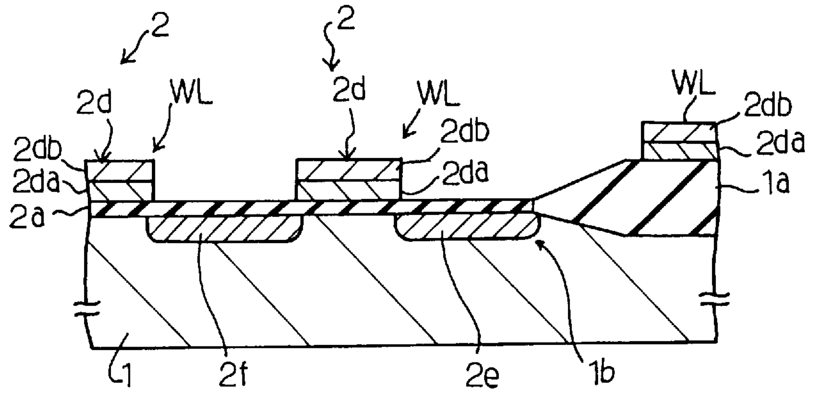
Fig·1B
PRIOR ART
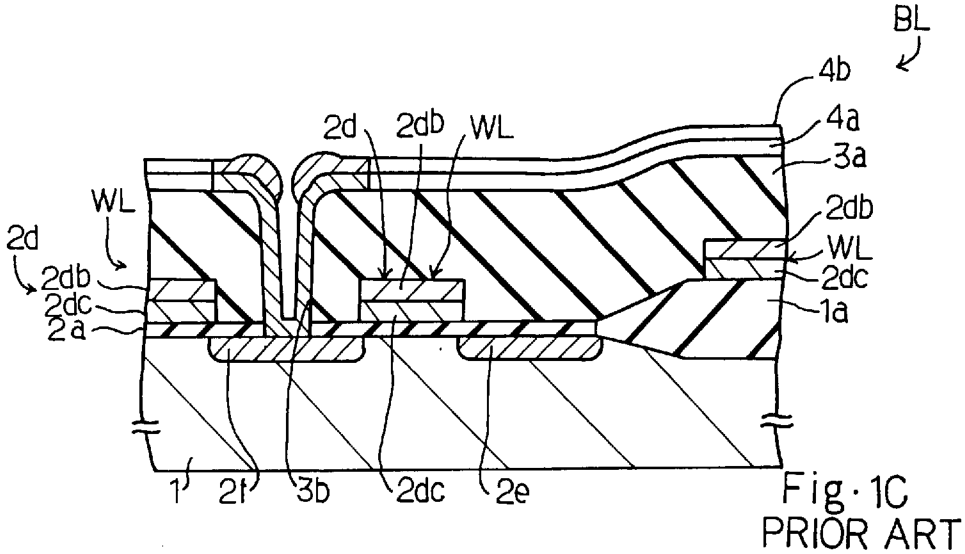
Fig·1C
PRIOR ART

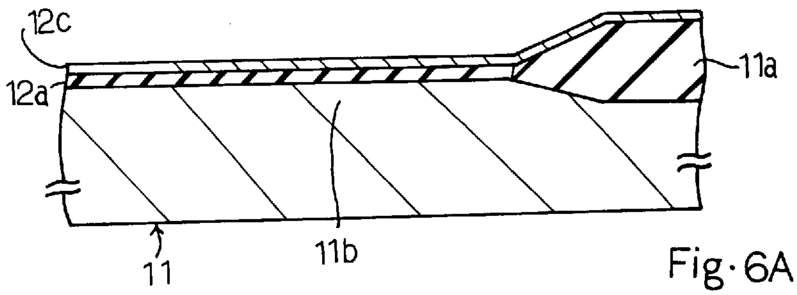
Fig·6A
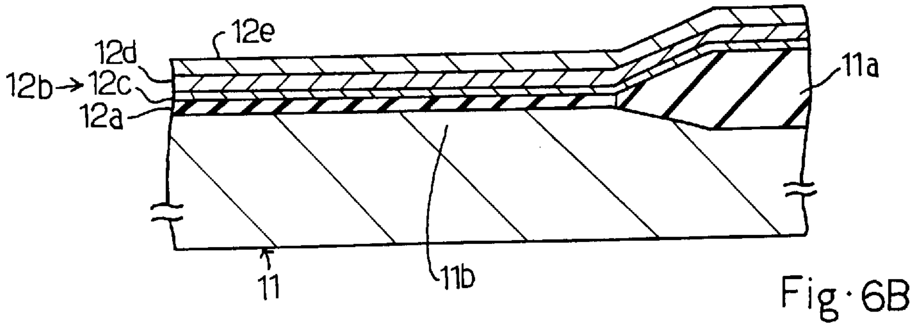
Fig·6B

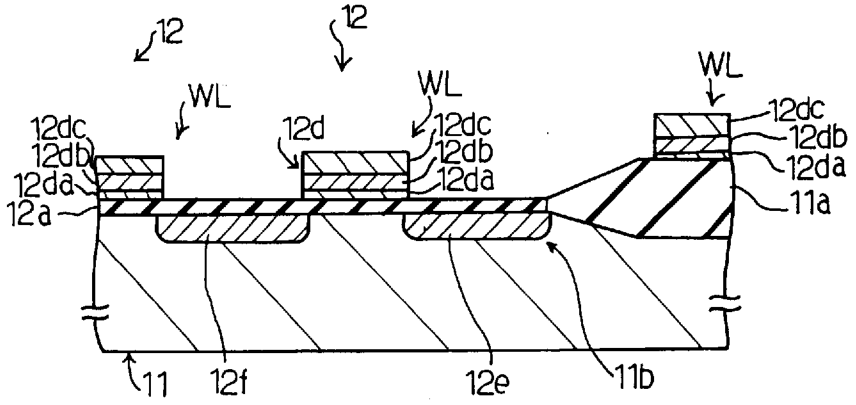
Fig·6C
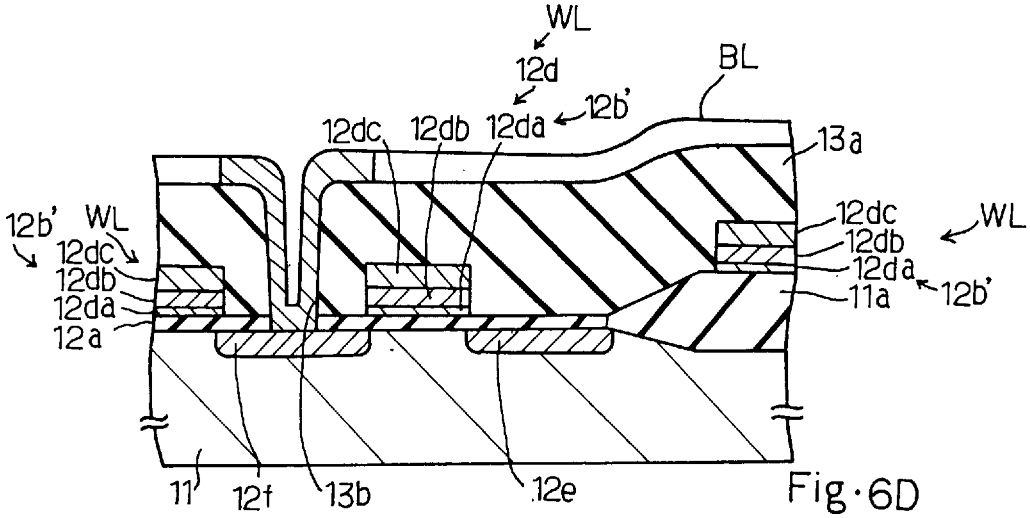
Fig·6D

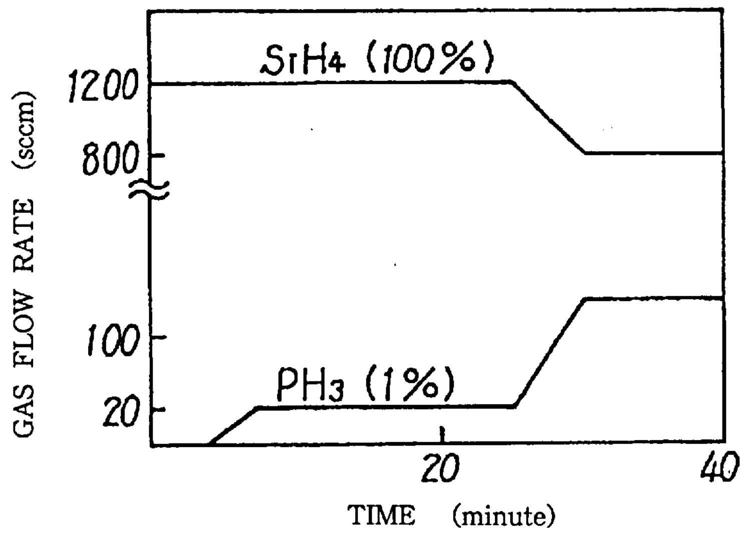
Fig·7
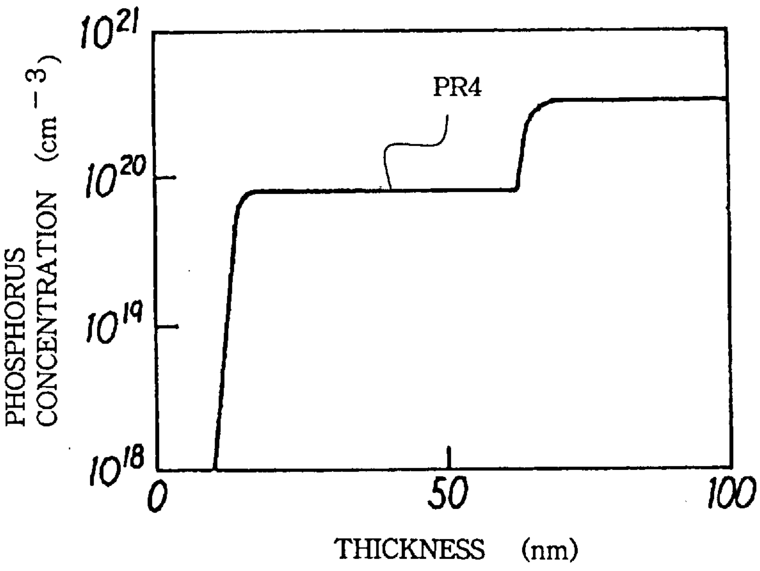
Fig·8

PROCESS OF FABRICATING SEMICONDUCTOR DEVICE HAVING DOPED POLYSILICON LAYER WITHOUT SEGREGATION OF DOPANT IMPURITY

FIELD OF THE INVENTION

This invention relates to a semiconductor device and, more particularly, to a process of fabricating a semiconductor device having a lamination of doped polysilicon and refractory metal silicide used as a wiring and an electrode.

DESCRIPTION OF THE RELATED ART

Doped polysilicon finds a wide variety of application such as, for example, an gate electrode of a field effect transistor, a bit line and a stacked capacitor in a dynamic random access memory device. The doped polysilicon per se is electrically conductive, and forms the gate electrode, the bit line and the stacked capacitor. A doped polysilicon strip is sometimes laminated with a metal silicide strip, and the doped polysilicon strip and the metal silicide strip form in combination the gate electrode, the bit line and the electrode of the stacked capacitor.

Various processes have been proposed to form a doped polysilicon layer. A typical example is a low-pressure chemical vapor deposition followed by a solid-phase diffusion. Intentionally undoped polysilicon is deposited through the low-pressure chemical vapor deposition, and the intentionally undoped polysilicon is treated with heat in an impurity source such as phosphorous trichloride. Then, the dopant impurity is diffused into the intentionally undoped polysilicon, and a doped polysilicon is obtained. The solid-phase diffusion may be replaced with an ion-implantation.

The doped silicon may be deposited through an in-situ doping during the low-pressure chemical vapor deposition. However, if the doped polysilicon is deposited over 600 degrees in centigrade, dopant concentration and the thickness are not uniform over the polysilicon layer, and, for this reason, it is recommendable to deposit doped amorphous silicon over 600 degrees in centigrade. The doped amorphous silicon is crystallized over 800 degrees in centigrade, and the crystallization imparts good conductivity to the doped silicon layer. Thus, the deposition technology for doped polysilicon is categorized into two groups, i.e., introducing dopant impurity into intentionally undoped polysilicon and the in-situ doping during the growth of silicon.

Comparing the two deposition technologies, the in-situ doping is simpler than the other, and is desirable, because the manufacturer wants to simplify a complicated process sequence for fabricating an ultra large scale integration.

FIGS. 1A to 1E illustrate a prior art process for fabricating a dynamic random access memory cell. The process starts with preparation of a p-type silicon substrate 1. A thick field oxide layer 1*a* is selectively grown on the major surface of the p-type silicon substrate 1, and defines an active area 1*b* assigned to a pair of dynamic random access memory cells.

The surface portion of the active area 1*b* is thermally oxidized at 700 degrees to 900 degrees in centigrade, and the active area 1*b* is covered with a thin gate oxide layer 2*a*. Phosphorous-doped amorphous silicon is deposited to 100 nanometers thick over the entire surface of the structure, and the phosphorous is introduced into the amorphous silicon at $1.5\times10^{20}$ $cm^{-3}$ during the growth. The phosphorous-doped amorphous silicon thus deposited over the entire surface forms a phosphorous-doped amorphous silicon layer 2*b*. Tungsten silicide is further deposited to 100 nanometers thick over the phosphorous-doped amorphous silicon layer 2*b* by using a sputtering technique, and forms a tungsten silicide layer 2*c* as shown in FIG. 1A. After the growth of the tungsten silicide layer 2*c*, phosphorous may be ion implanted into the phosphorous-doped amorphous silicon layer 2*b* at dose of $5\times10^{19}$ $cm^{-2}$ under acceleration energy of 30 KeV so as to compensate the phosphorous diffused from the phosphorous-doped amorphous silicon layer 2*b* into the tungsten silicide layer 2*c*. The phosphorous reaches the boundary between the phosphorous-doped amorphous silicon layer 2*b* and the tungsten silicide layer 2*c*.

Subsequently, a photo-resist etching mask (not shown) is patterned on the tungsten silicide layer 2*c* by using lithographic techniques, and the tungsten silicide layer 2*c* and the phosphorous-doped amorphous silicon layer 2*b* are selectively etched away through a dry etching technique. Thus, the phosphorous-doped amorphous silicon layer 2*b* and the tungsten silicide layer 2*c* are patterned into word lines WL, and the word lines WL is implemented by the lamination of the phosphorous-doped amorphous silicon strip 2*da* and the tungsten silicide strips 2*db*. Parts of word lines WL on the gate oxide layer 2*a* serve as gate electrodes 2*d*. The photo-resist etching mask is stripped off.

Using the gate electrodes as an ion-implantation mask, phosphorous or arsenic is ion implanted into the active area 1*b*, and forms an n-type source region 2*e* and an n-type drain region 2*f* as shown in FIG. 1B. The gate oxide layer 2*a*, the gate electrode 2*d*, the n-type source region 2*e* and the n-type drain region 2*f* as a whole constitute an n-channel enhancement type switching transistor 2.

Subsequently, boro-phosphosilicate glass is deposited to 500 nanometers thick over the n-channel enhancement type switching transistor 2, and the boro-phosphosilicate glass layer is reflowed in nitrogen ambience so as to improve the step coverage. The boro-phosphosilicate glass layer forms an inter-level insulating layer 3*a*.

While the boro-phosphosilicate glass layer is being reflowed, the phosphorous-doped amorphous silicon strips 2*da* are crystallized, and are converted to phosphorous-doped polysilicon strips 2*dc*. Thus, the word lines WL and, accordingly, the gate electrodes 2*d* are implemented by the lamination of the phosphorous-doped polysilicon strips 2*dc* and the tungsten silicide strips 2*db*.

A photo-resist etching mask (not shown) is provided on the inter-level insulating layer 3*a*, and has an opening of 350 nanometers square over the n-type drain region 2*f*. The photo-resist etching mask exposes a part of the inter-level insulating layer 3*a* to etchant used in a dry etching, and the etchant forms a bit contact hole 3*b*. The n-type drain region 2*f* is exposed to the bit contact hole 3*b*.

Phosphorous-doped amorphous silicon is deposited to 100 nanometers thick over the entire surface of the resultant structure, and the phosphorous concentration is of the order of $2\times10^{20}$ $cm^{-3}$. The phosphorous-doped amorphous silicon topographically extends the inner and upper surfaces of the inter-level insulating layer 3*a*, and forms a phosphorous-doped amorphous silicon layer. Tungsten silicide is topographically deposited to 100 nanometers thick over the entire surface of the phosphorous-doped amorphous silicon layer, and phosphorous is ion implanted into the boundary between the phosphorous-doped amorphous silicon layer and the tungsten silicide layer under the same conditions as the lamination of the amorphous silicon layer and the tungsten silicide layer on the gate oxide layer 2*a*.

A photo-resist etching mask (not shown) is provided on the tungsten silicide layer, and the lamination of the phosphorous-doped amorphous silicon layer and the tungsten silicide layer is respectively patterned into a phosphorous-doped amorphous silicon strip 4*a* and a tungsten silicide strip 4*b*. The phosphorous-doped amorphous silicon strip 4*a* and the tungsten silicide strip 4*b* form in combination a bit line BL as shown in FIG. 1C.

Phosphosilicate glass is deposited over the bit line BL on the first inter-level insulating layer 3*a*, and the phosphosilicate glass is reflowed. The phosphosilicate glass layer forms a second inter-level insulating layer 3*c*. While the phosphosilicate glass layer is being reflowed, the phosphorous-doped amorphous silicon strip 4*a* is crystallized, and is converted to a phosphorous-doped polysilicon strip 4*c*.

A photo-resist etching mask (not shown) is provided on the second inter-level insulating layer 3*c*, and exposes a part of the phosphosilicate glass layer to an etchant. The etchant selectively removes the phosphosilicate glass and the boro-phosphosilicate glass from the second inter-level insulating layer 3*c* and the first inter-level insulating layer 3*a*, and forms a node contact hole 3*d*. The n-type source region 2*e* is exposed to the node contact hole 3*d*.

Doped amorphous silicon is deposited over the entire surface of the resultant structure. The doped amorphous silicon fills the node contact hole 3*d*, and swells into a doped amorphous silicon layer 5*a* as shown in FIG. 1D.

A photo-resist etching mask (not shown) is provided on the doped amorphous silicon layer 5*a*, and exposes a part of the doped amorphous silicon layer 5*a* to an etchant. The etchant patterns the doped polysilicon layer 5*a* into a storage node electrode 5*b*.

The storage node electrode 5*b* is covered with a dielectric film structure 5*c*, and the doped amorphous silicon for the storage node electrode 5*b* is converted to a doped polysilicon during a heat treatment for the dielectric film structure 5*c*. Finally, the dielectric film structure 5*c* is covered with a cell plate electrode 5*d*, and the storage node electrode 5*b*, the dielectric film structure 5*c* and the cell plate electrode 5*d* form in combination a stacked storage capacitor 5 as shown in FIG. 1E.

Thus, the prior art process is simplified by using the in-situ doping. However, the prior art process encounters a problem in that the dopant impurity is diffused from the doped polysilicon strips 2*dc* and 4*c*. The diffusion results in a final dopant concentration lower than a target value and undesirable segregation of the dopant impurity.

As described hereinbefore, the layers of the semiconductor structure are repeatedly applied with heat. The heat diffuses the dopant impurity from the doped silicon strips into the tungsten silicide strips 2*db*/4*b*, and the dopant impurity is segregated at the boundaries between the doped polysilicon strip 2*dc* and the gate oxide layer 2*a*. The tungsten silicide has a large solubility. When the dopant concentration of a doped silicon strip is low, most of the dopant impurity is diffused into a tungsten silicide strip, and a depletion layer extends from the boundary between the doped silicon strip and the gate oxide layer during an operation. This results in deterioration of the transistor characteristics.

The ion-implantation after the deposition of the tungsten silicide compensates the dopant impurity diffused into the tungsten silicide layer. The ion-implantation after the deposition is hereinbelow referred to as "post ion-implantation". However, the ion implantation damages the crystal structure of the doped polysilicon, and a dispersion of dopant concentration takes place in the direction of depth of the doped polysilicon layer. A part of the ion-implanted impurity reaches the gate oxide layer 2*a*, and damages the gate oxide layer 2*a*.

A miniature field effect transistor for an ultra large scale integration has an extremely thin gate electrode, because a thick gate electrode deteriorates the step coverage over the miniature field effect transistor. In this situation, the post ion-implantation is liable to damage the gate oxide layer, and compensation is getting harder and harder.

If a doped polysilicon strip is initially doped with a large amount of dopant impurity, the doped polysilicon strip may be still heavily doped after the heat treatments. However, such a heavily doped amorphous silicon strip is very likely to segregate the dopant impurity at the boundary to the gate oxide layer. This is because of the fact that the crystallization of the amorphous silicon proceeds at a low speed under 850 degrees in centigrade. The dopant impurity is traveled over a long distance during the combination of silicon atoms, and is pushed out from the silicon layer. A low-temperature process becomes majority for an ultra large scale integration, because the ultra large scale integration requires shallow p-n junctions. The low-temperature process promotes "push-out" from the silicon layer. For this reason, the large initial dopant concentration does not eliminate the problem from the prior art process.

FIGS. 2A and 2B illustrate two impurity profiles PR1 and PR2 respectively created in two phosphorous-doped amorphous silicon layers. The first impurity profile PR1 and the second impurity profile PR2 indicate a relatively low dopant concentration and a relatively high dopant concentration, respectively, and the dopant concentrations represented by the impurity profiles PR1 and PR2 are $8\times10^{19}$ $cm^{-3}$ and $3\times10^{20}$ $cm^{-3}$. When the phosphorous-doped amorphous silicon layers are treated with heat, the phosphorous is diffused from the amorphous silicon close to the tungsten silicide layer toward the gate oxide layer, and the impurity profiles PR1/PR2 incline as indicated by plots PR1' and PR2' (see FIGS. 3A and 3B). The impurity profiles PR1'/PR2' teach us that the segregation takes place around the boundaries between the gate oxide layers and the doped silicon layers. Although the phosphorus is decreased from both boundaries between the doped silicon layers and the tungsten silicide layers, the decrement of the doped silicon layer with the relative low dopant concentration is drastic, and the segregated phosphorous is recrystallized during a heat treatment carried out thereafter. The recrystallized phosphorous imparts a large stress to the gate oxide layer, and decreases the withstanding voltage of the gate oxide layer.

FIG. 4 illustrates the relative frequency of damaged gate oxide layer in terms of the strength of electric field. When the leakage current density reaches 0.1 $mA/cm^2$, the gate oxide layer is evaluated to be damaged. The B-mode defect is 10 to 20 percent around 4 to 8 MV/cm.

The segregation of dopant impurity is observed in a contact hole. As described hereinbefore, the bit line BL is held in contact with the n-type drain region 2*f*, and the storage node electrode 5*b* is held in contact with the n-type source region 2*e*. In the contact holes 3*b*/3*d*, the dopant impurity is also pushed out during the crystallization of the doped amorphous silicon strips 4*a*/5*b*, and tends to be segregated at the boundaries between the doped silicon strips 4*a*/5*b* and the n-type source/drain regions 2*e*/2*f*. The segregated dopant impurity is further diffused into the silicon substrate 1 during a heat treatment. Upon completion of the contact hole 3*b*/3*d*, the semiconductor structure is taken out from the etching system, and is moved to a deposition system. While an operator is conveying the semiconductor structure from the etching system to the deposition system, the n-type source/drain region 2*e*/2*f* is unavoidably exposed to the atmosphere, and a natural oxide is grown on the n-type source/drain region 2*e*/2*f*. The phosphorous is segregated into the natural oxide, and the phosphorous-doped natural oxide serves as a diffusion source. FIG. 5 illustrates an impurity profile PR3 around the contact between the n-type source/drain region 2*e*/2*f* and the doped polysilicon strip 4*c*/5*b*. The impurity profile PR3 indicates the segregation around the boundary between the n-type source/drain region 2*e*/2*f* and the doped polysilicon strip 4*c*/5*b*.

The diffusion source supplies the phosphorous through the n-type source/drain region 2*e*/2*f* into the p-type silicon substrate 1. The phosphorous thus diffused into the silicon substrate 1 changes the channel length, and decreases the threshold of a parasitic transistor.

Thus, the dopant impurity diffused from the doped silicon layer is causative of the deterioration of the circuit components of the prior art dynamic random access memory device.

SUMMARY OF THE INVENTION

It is therefore an important object of the present invention to provide a process of fabricating a semiconductor device which restricts a diffusion of dopant impurity from a doped silicon layer and a segregation of the dopant impurity.

To accomplish the object, the present invention proposes to form an intentionally undoped amorphous semiconductor material under a doped amorphous semiconductor material.

In accordance with the present invention, there is provided a process of fabricating a semiconductor device, comprising the steps of: a) forming an insulating layer; b) forming an intentionally undoped amorphous silicon layer on the insulating layer; c) forming a doped amorphous silicon layer containing a dopant impurity over the intentionally undoped amorphous silicon layer; and d) heating the intentionally undoped amorphous silicon layer and the doped amorphous silicon layer so as to crystallize the intentionally undoped amorphous silicon layer and the doped amorphous silicon layer.

BRIEF DESCRIPTION OF THE DRAWINGS

The features and advantages of the process according to the present invention will be more clearly understood from the following description taken in conjunction with the accompanying drawings in which:

FIGS. 1A to 1E are cross sectional views showing the prior art process of fabricating the dynamic random access memory cell;

FIGS. 6A to 6F are cross sectional views showing the process of fabricating a semiconductor dynamic random access memory device according to the present invention;

FIG. 7 is a graph showing the gas glow rate in terms of time during a deposition of amorphous silicon for a gate electrode;

FIG. 8 is a graph showing the phosphorous content varied with the thickness of the amorphous silicon layer;

DESCRIPTION OF THE PREFERRED EMBODIMENTS

First Embodiment

Figure 1D:
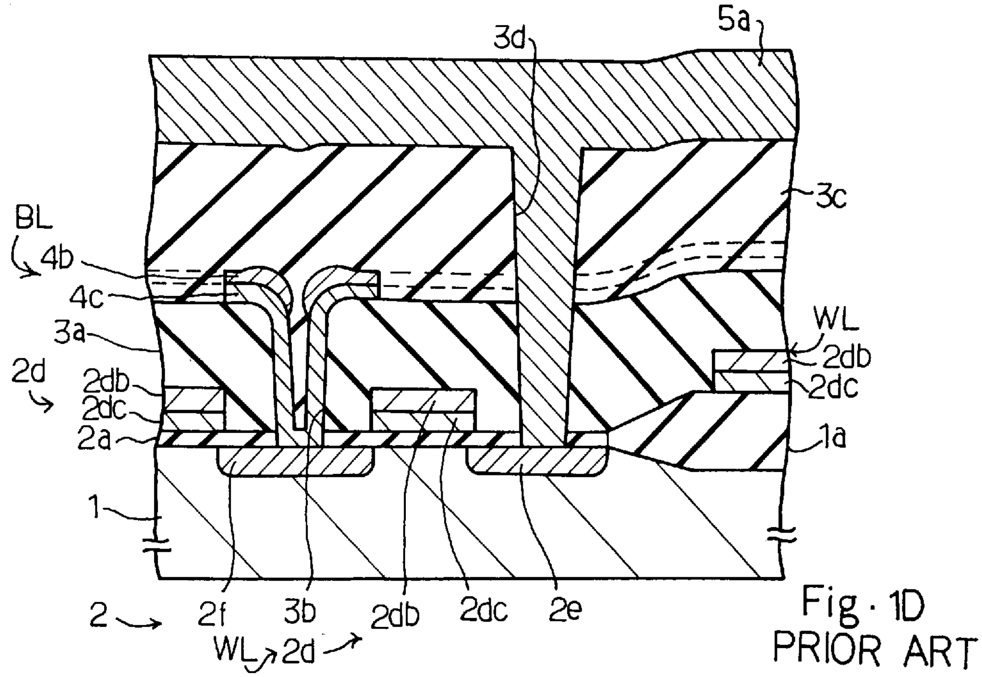
Figure 1E:
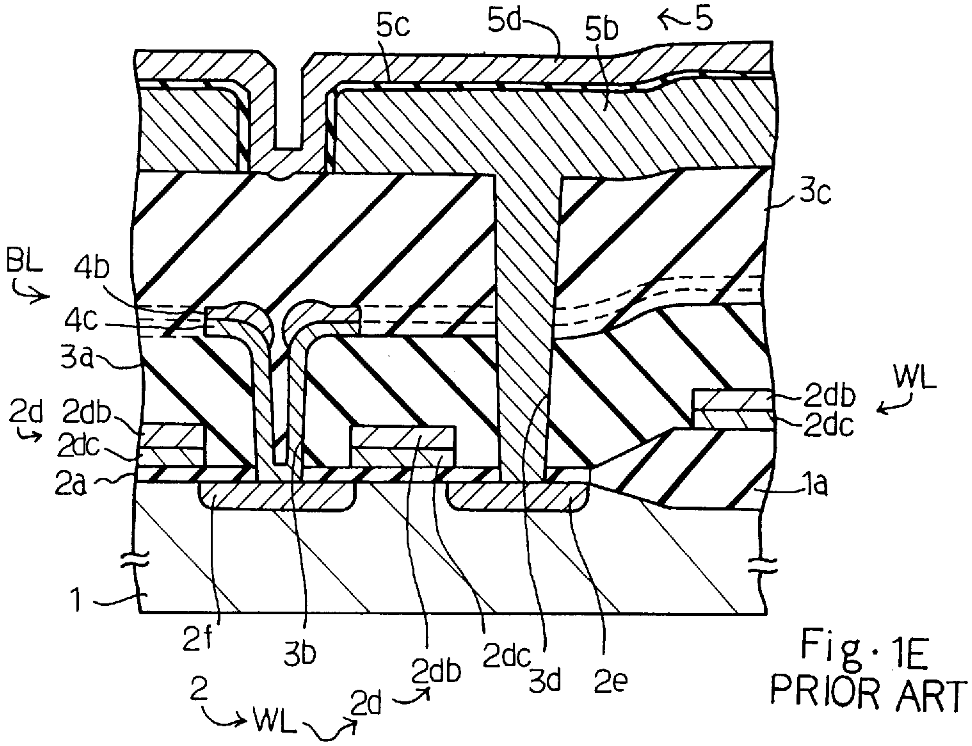
Figure 2A:
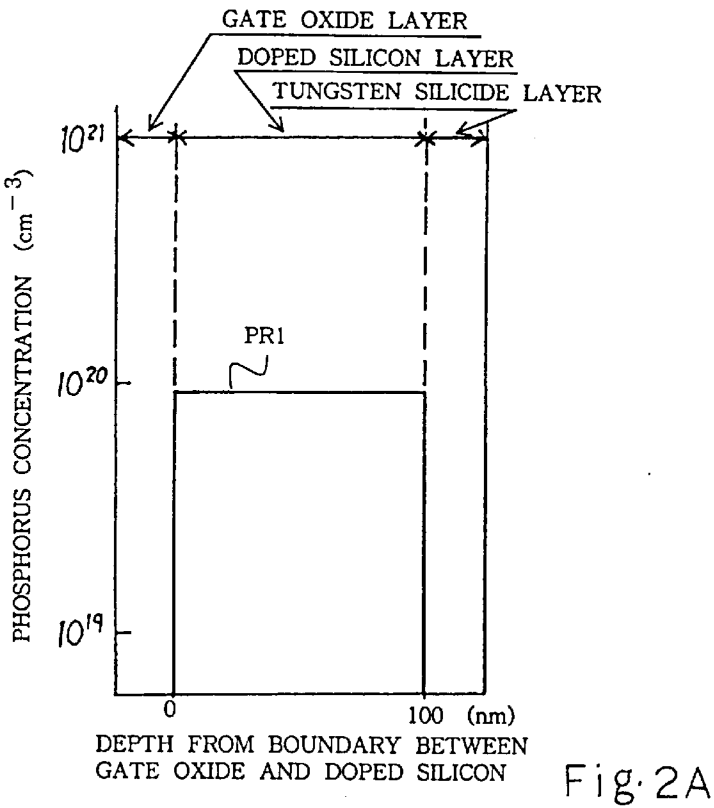
FIGS. 2A and 2B are graphs showing the impurity profiles before the heat treatment.
Figure 2B:
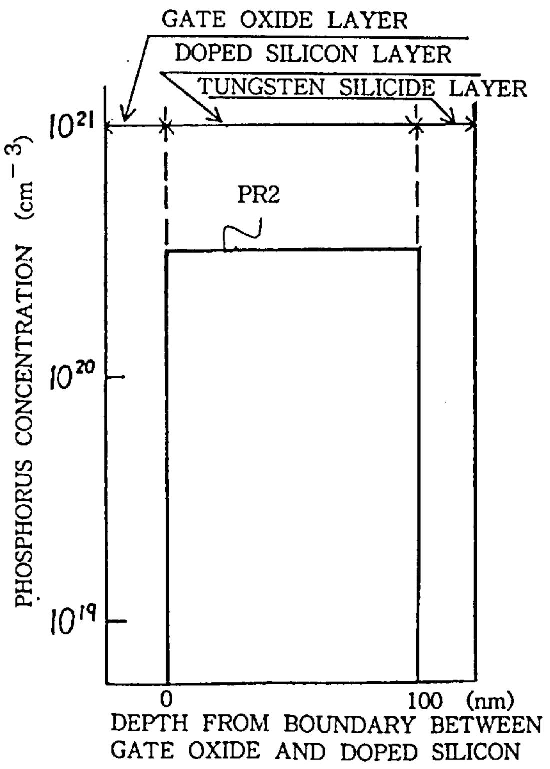
Figure 3A:
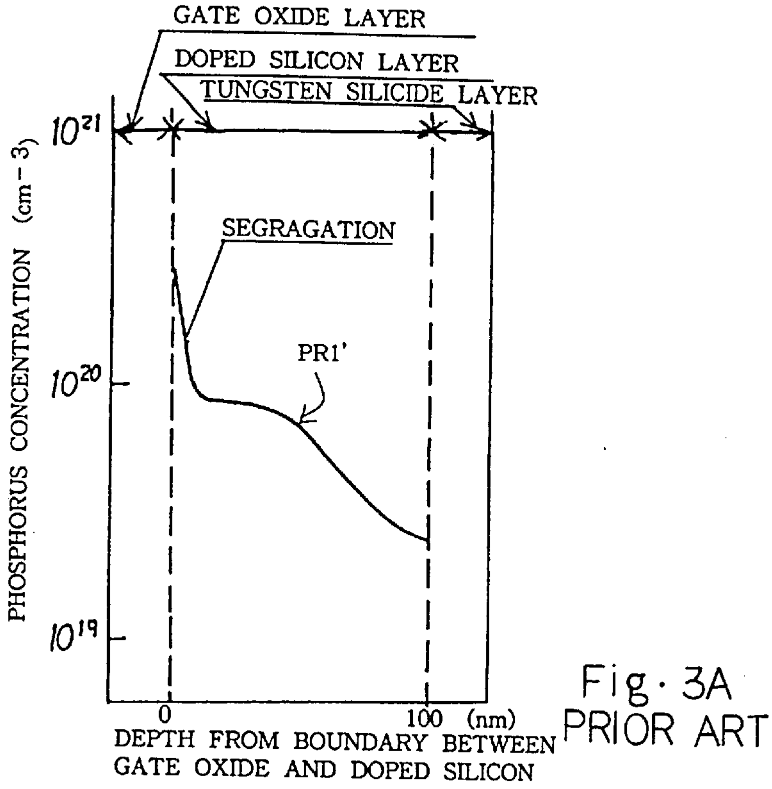
FIGS. 3A and 3B are graphs showing the impurity profiles after the heat treatment.
Figure 3B:
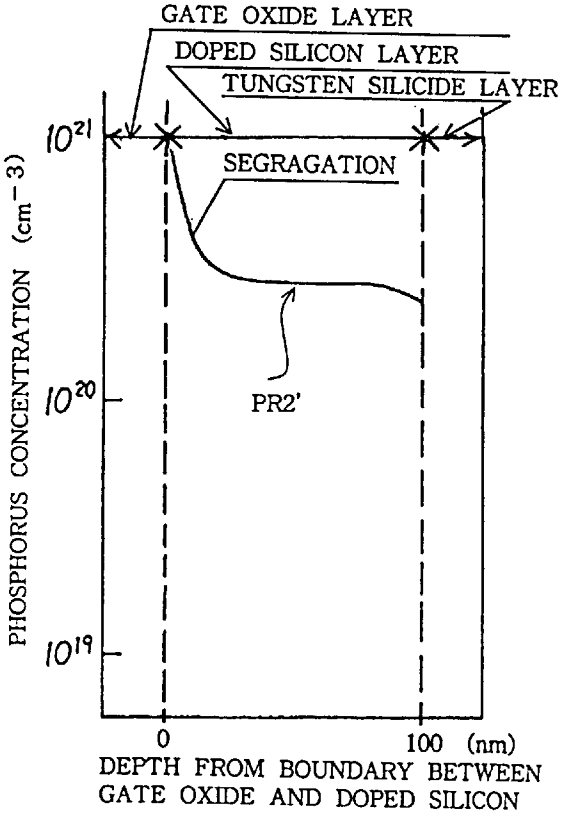

Referring to FIGS. 6A to 6F of the drawings, a process of fabricating a semiconductor dynamic random access memory device embodying the present invention starts with preparation of a p-type silicon substrate 11. A thick field oxide layer 11*a* is selectively grown on the major surface of the p-type silicon substrate 11, and defines an active area 11*b* assigned to a pair of dynamic random access memory cells.

The surface portion of the active area 11*b* is thermally oxidized at 700 degrees to 900 degrees in centigrade, and the active area 11*b* in covered with a thin gate oxide layer 12*a* of 10 nanometers thick.

Subsequently, the semiconductor structure, i.e., the p-type silicon substrate 11 covered with the thick field oxide layer 11*a* and the thin gate oxide layer 12*a* is placed in a reactor (not shown) of a low-pressure chemical vapor deposition system, and amorphous silicon layer 12*b* is deposited to 100 nanometers thick over the entire surface of the semiconductor structure. First, only silane is introduced into the reactor (see FIG. 7), and intentionally undoped amorphous silicon 12*c* is deposited for 3 to 4 minutes. An intentionally undoped amorphous silicon layer 12*c* is formed on the thick field oxide layer 11*a* and the thin gate oxide layer 12*a* as shown in FIG. 6A, and is of the order of 10 nanometers thick. The gas pressure is regulated to 2 torr, and silane is decomposed at 530 degrees in centigrade.

Subsequently, phosphine is mixed into the silane (see FIG. 7), and the gas pressure and the temperature is maintained. The phosphine is mixed into nitrogen at 1 percent, and the gaseous mixture of phosphine and nitrogen is hereinbelow simply referred to as "phosphine gas". The phosphine gas is increased at 5 sccm/min. When the phosphine gas reaches 20 sccm, the phosphine gas is maintained at 20 sccm for 20 minutes. Then, a lightly phosphorous-doped amorphous silicon layer is deposited to 50 nanometers thick over the intentionally undoped amorphous silicon layer 12*c*, and the lightly phosphorous-doped amorphous silicon layer contains the phosphorous at $0.8\times10^{20}$ $cm^{-3}$. The phosphine gas is increased to 100 sccm at 10 sccm/minute, and the silane gas is decreased to 800 sccm at 40 sccm/minute. A heavily phosphorous-doped amorphous silicon layer is deposited to 40 nanometers thick for 10 minutes, and the phosphorous concentration is of the order of $3\times10^{20}$ $cm^{-3}$. Thus, the phosphorous-doped amorphous silicon layer 12*d* of 90 nanometers thick is formed on the intentionally undoped amorphous silicon layer 12*c*, and the intentionally undoped amorphous silicon layer 12*c* and the phosphorous-doped amorphous silicon layer 12*d* form the amorphous silicon layer 12*b* of 100 nanometers thick. The deposition speed under the above described conditions is substantially constant regardless of the phosphine, and ranges from 2.4 nanometers to 2.8 nanometers per minute. The phosphorous content in the amorphous silicon layer 12*b* is represented by plots PR4 in FIG. 8.

Subsequently, tungsten silicide is further deposited to 100 nanometers thick over the amorphous silicon layer 12*b* by using a sputtering technique, and forms a tungsten silicide layer 12*e* as shown in FIG. 6B. No phosphorous is ion implanted into the boundary between the tungsten silicide layer 12*e* and the heavily phosphorous doped amorphous silicon layer 12*d*.

Subsequently, a photo-resist etching mask (not shown) is patterned on the tungsten silicide layer 12*e* by using lithographic techniques, and the tungsten silicide layer 12*e* and the amorphous silicon layer 12*b* are selectively etched away through a dry etching technique. Thus, the amorphous silicon layer 12*b* and the tungsten silicide layer 12*e* are patterned into word lines WL, and the word lines WL is implemented by the lamination of an intentionally undoped amorphous silicon strip 12*da*, a phosphorous-doped amorphous silicon strip 12*db* and a tungsten silicide strip 12*dc*. A parts of word line WL on the gate oxide layer 12*a* serves as a gate electrode 12*d*. Upon completion of the patterning, the photo-resist etching mask is stripped off.

Using the gate electrodes 12*d* as an ion-implantation mask, phosphorous or arsenic is ion implanted into the active area 11*b*, and forms an n-type source region 12*e* and an n-type drain region 12*f* as shown in FIG. 6C. The gate oxide layer 12*a*, the gate electrode 12*d*, the n-type source region 12*e* and the n-type drain region 12*f* as a whole constitute an n-channel enhancement type switching transistor 12.

Subsequently, boro-phosphosilicate glass is deposited to 500 nanometers thick over the n-channel enhancement type switching transistor 12, and the boro-phosphosilicate glass layer is reflowed around 850 degrees in centigrade in nitrogen ambience so as to improve the step coverage. The boro-phosphosilicate glass layer forms an inter-level insulating layer 13*a*.

While the boro-phosphosilicate glass layer is being reflowed, the amorphous silicon strips 12*b* are crystallized, and are converted to polysilicon strips 12*b*'. Thus, the polysilicon strip 12*b*' and the tungsten silicide strip 12*dc* form in combination the word line WL and, accordingly, the gate electrode 12*d*.

A photo-resist etching mask (not shown) is provided on the inter-level insulating layer 13*a*, and has an opening of 350 nanometers square over the n-type drain region 12*f*. The photo-resist etching mask exposes a part of the inter-level insulating layer 13*a* to etchant used in a dry etching, and the etchant forms a bit contact hole 13*b*. The n-type drain region 12*f* is exposed to the bit contact hole 13*b*.

Conductive material or materials are deposited over the entire surface of the resultant semiconductor structure, and swells into a conductive layer. A photo-resist etching mask (not shown) is provided on the conductive layer, and the conductive layer is patterned into a bit line BL as shown in FIG. 6D.

Phosphosilicate glass is deposited over the bit line BL on the first inter-level insulating layer 13*a*, and the phosphosilicate glass is reflowed. The silicon for the word lines WL is further crystallized during the heat treatment. The phosphosilicate glass layer forms a second inter-level insulating layer 13*c*. A photo-resist etching mask (not shown) is provided on the second inter-level insulating layer 13*c*, and exposes a part of the phosphosilicate glass layer to an etchant. The etchant selectively removes the phosphosilicate glass and the boro-phosphosilicate glass from the second inter-level insulating layer 13*c* and the first inter-level insulating layer 13*a*, and forms a node contact hole 13*d*. The n-type source region 12*e* is exposed to the node contact hole 13*d*.

Figure 6E:
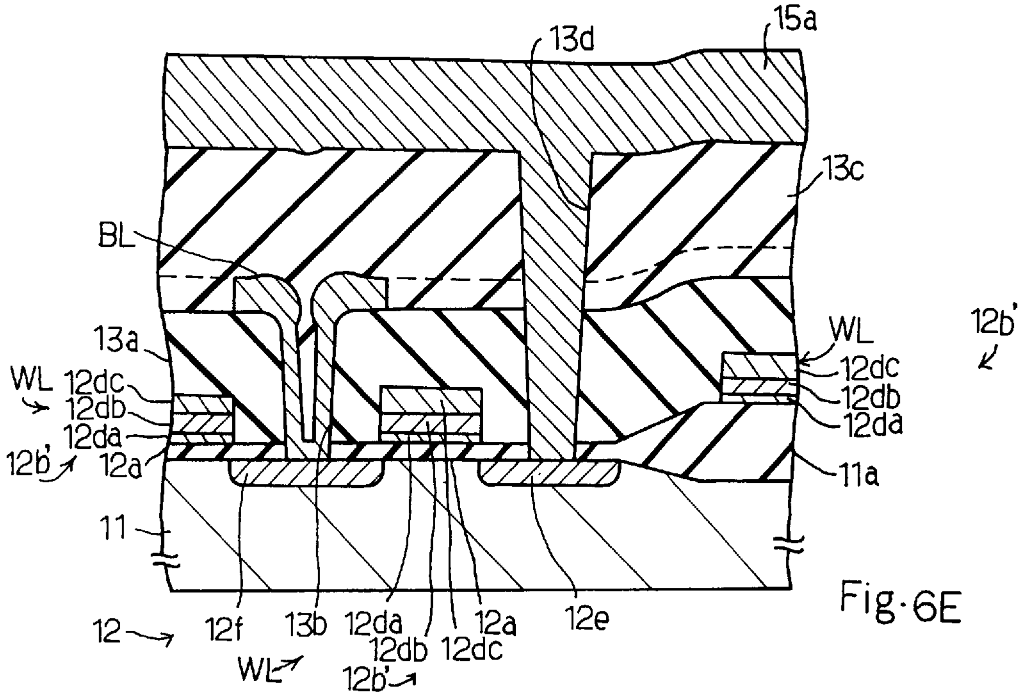

Conductive material is deposited over the entire surface of the resultant structure. The conductive material fills the node contact hole 13*d*, and swells into a conductive layer 15*a* as shown in FIG. 6E.

A photo-resist etching mask (not shown) is provided on the conductive layer 15*a*, and exposes a part of the conductive layer 15*a* to an etchant. The etchant patterns the conductive layer 15*a* into a storage node electrode 15*b*.

Figure 6F:
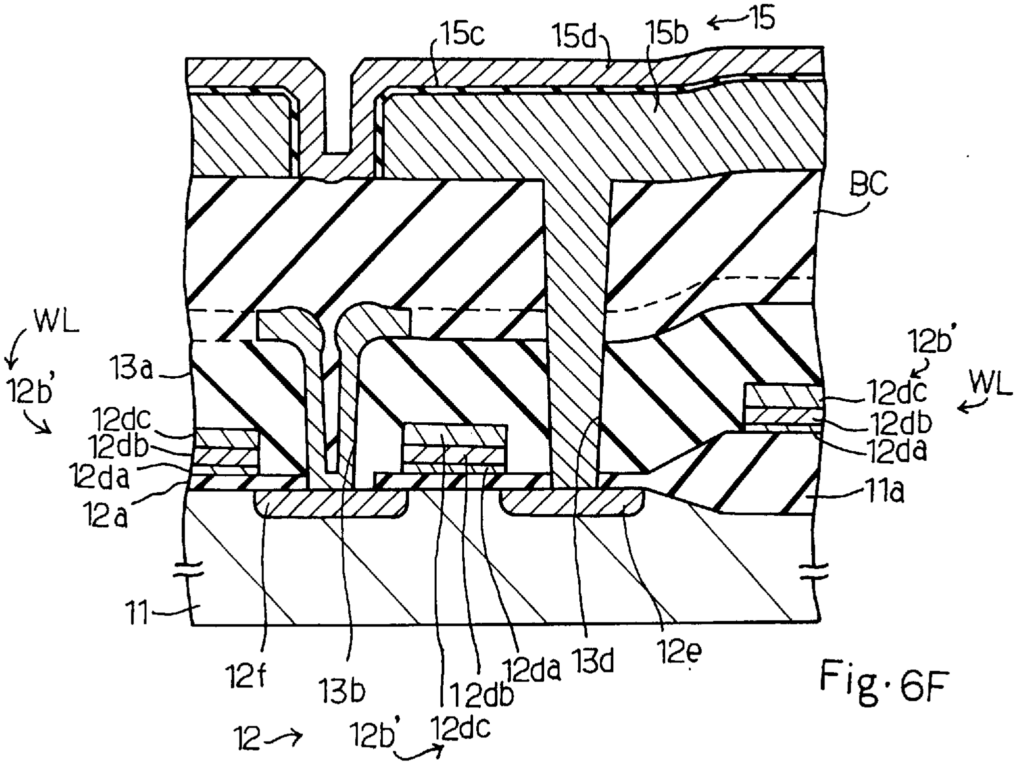

The storage node electrode 15*b* is covered with a dielectric film structure 15*c*, and the polysilicon layer 12*b*' is further crystallized during a heat treatment for the dielectric film structure 15*c*. The heat treatment is carried out at 850 degrees in centigrade. Finally, the dielectric film structure 15*c* is covered with a cell plate electrode 15*d*, and the storage node electrode 15*b*, the dielectric film structure 15*c* and the cell plate electrode 15*d* form in combination a stacked storage capacitor 15 as shown in FIG. 6F.

Figure 9:
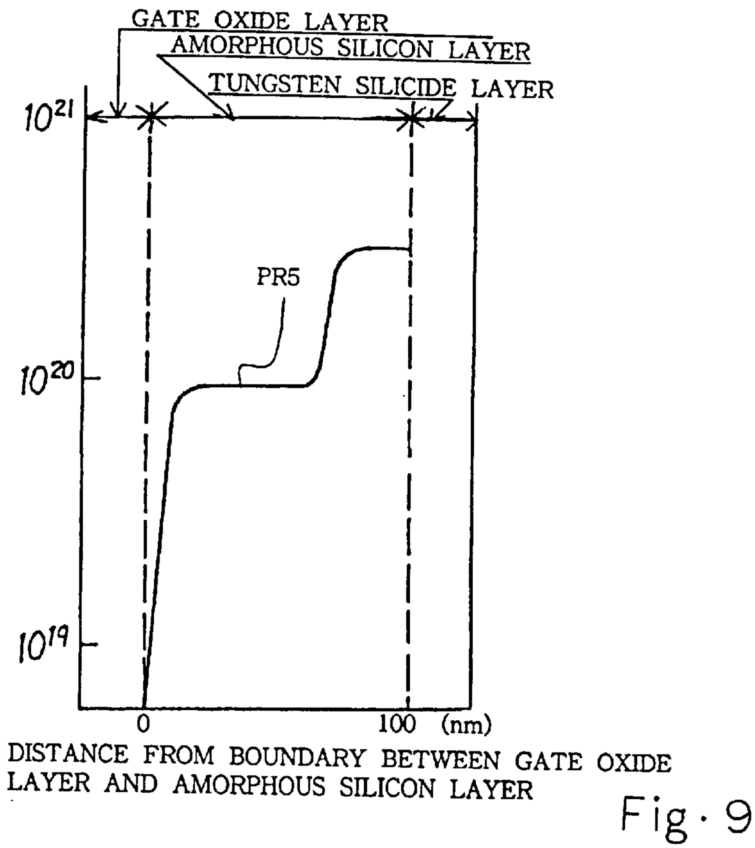
FIG. 9 is a graph showing an impurity profile created in an amorphous silicon layer.
Figure 10:
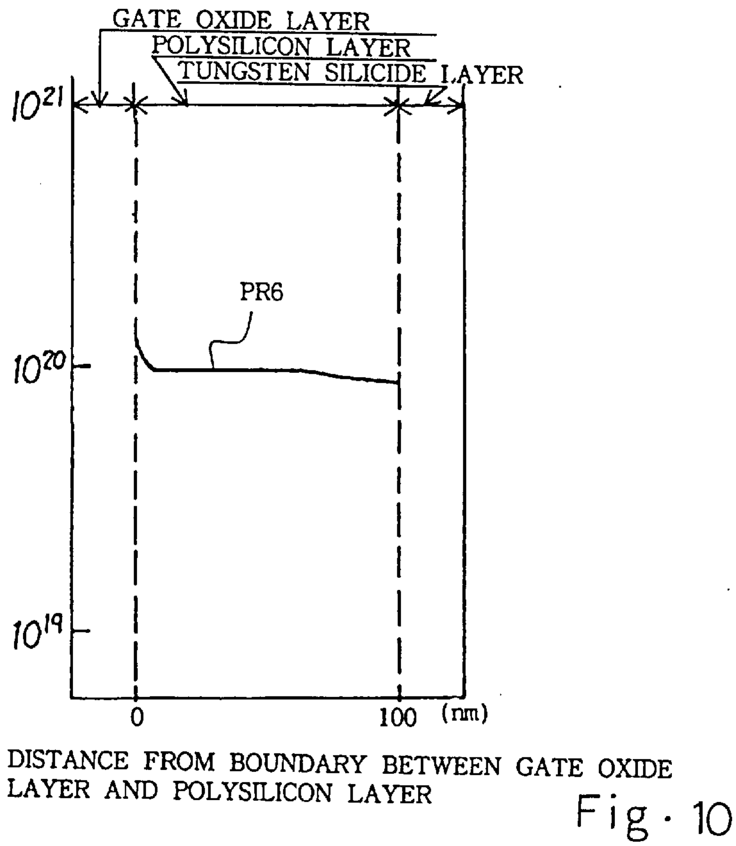
FIG. 10 is a graph showing an impurity profile created in a polysilicon layer.

The present inventor measured the dopant As concentration in the amorphous silicon layer 12*b* before the growth of the inter-level insulating layer 13*a* and the dopant concentration in the polysilicon layer 12*b*' upon completion of the semiconductor dynamic random access memory device. The present inventor plotted the dopant concentration in the amorphous silicon layer 12*b* as indicated by plots PR5 in FIG. 9 and the dopant concentration in the polysilicon layer 12*b*' as indicated by plots PR6 in FIG. 10. The impurity profile represented by the plots PR5 stepwise increased from the boundary between the gate oxide layer 12*a* and the amorphous silicon layer 12*b*. However, the impurity profile PR6 became flat after the heat treatment. The dopant impurity around the boundary between the amorphous silicon layer 12*b* and the tungsten silicide layer 12*e* was so large that the dopant impurity was still large after the diffusion from the boundary toward the intentionally undoped amorphous silicon layer 12*c*. On the other hand, the intentionally undoped amorphous silicon layer 12*c* was contiguous to the gate oxide layer 12*a*, and the phosphorous was hardly segregated at the boundary therebetween.

Figure 4:
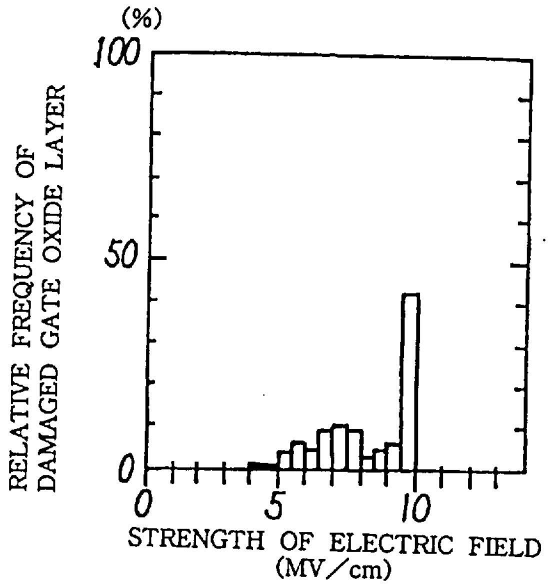
FIG. 4 in a graph showing the relative frequency of damaged gate oxide layers in terms of the strength of electric field.
Figure 11:
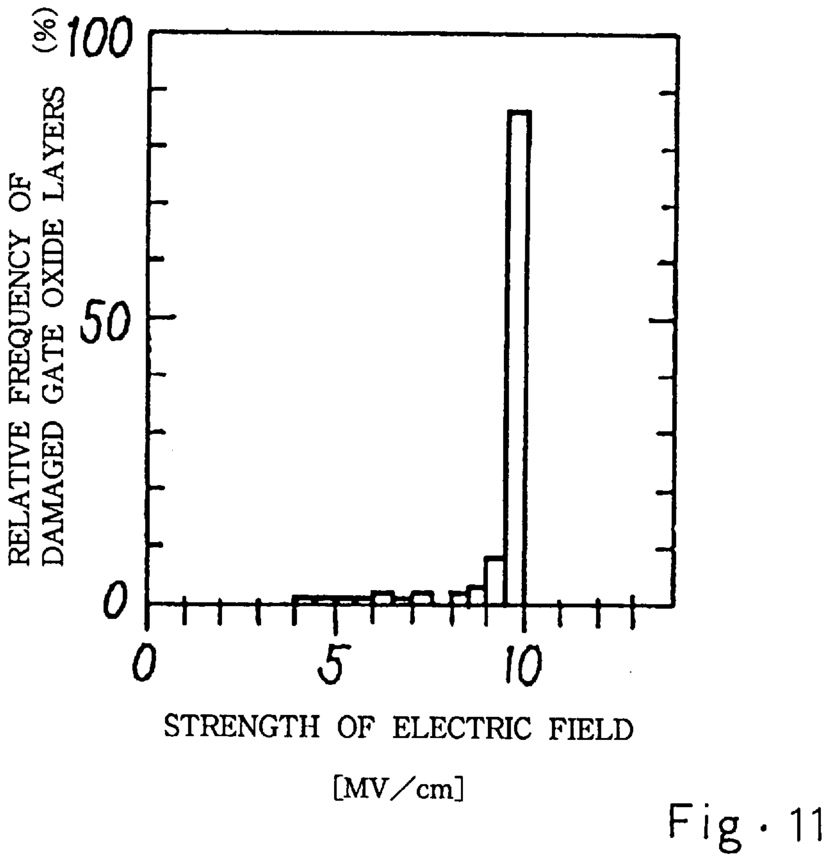
FIG. 11 is a graph showing a relative frequency of damaged gate oxide layer in terms of the strength of electric field.

The present inventor further evaluated the influence of segregated phosphorous. The present inventor applied an electric field across the gate oxide layers 12*a*, and increased the strength of electric field to see whether or not the large amount of leakage current flowed across the gate oxide layer 12*a*. When the leakage current exceeded 0.1 mA/cm$^2$, the present inventor decided it to be damaged. The relative frequency of damaged gate oxide layers was plotted in FIG. 11. Comparing FIG. 11 with FIG. 4, it was understood that the damaged gate oxide layers 12*a* were negligible below 9.5 MV/cm, and this tendency taught us that the segregated phosphorous was little. Thus, the intentionally undoped amorphous silicon layer 12*c* improved the gate oxide layer 12*a*.

Second Embodiment

Figure 12:
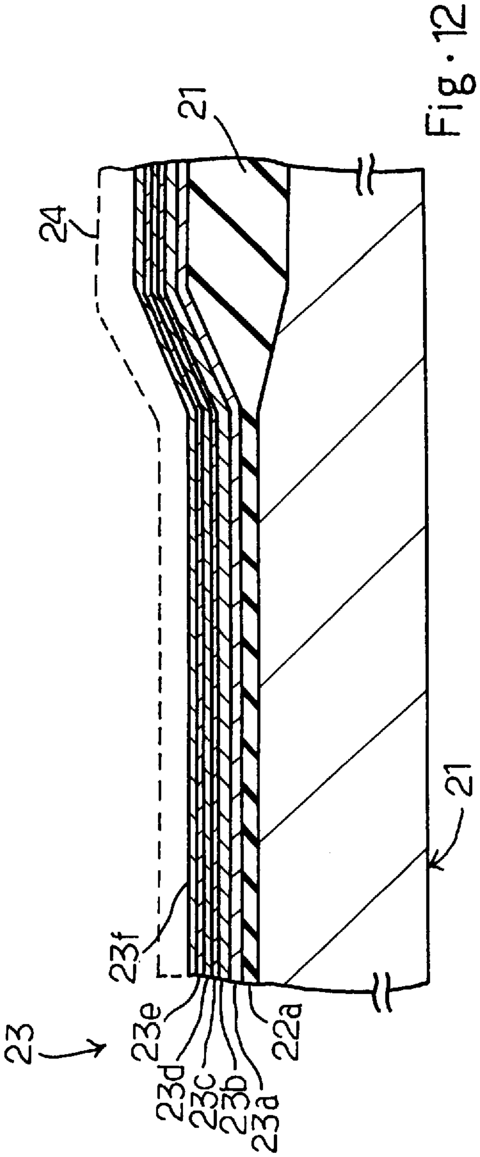
FIG. 12 is a cross sectional view showing the structure of a semiconductor dynamic random access memory device upon growth of an amorphous silicon layer.

Another process embodying the present invention is described hereinbelow. The process implementing the second embodiment is similar to the first embodiment except for the growth of an amorphous silicon layer, and, for this reason, only the growing step is illustrated in FIG. 12.

The process also starts with preparation of a p-type silicon substrate 21, and a thick field oxide layer 21*a* is selectively grown on the major surface of the p-type silicon substrate 21. The thick field oxide layer 21*a* defines an active area assigned to two dynamic random access memory cells, and a surface portion of the active area is thermally oxidized. A thin gate oxide layer 22*a* is grown on the active area.

Subsequently, an amorphous silicon layer 23 is deposited to 100 nanometers thick by using the low pressure chemical vapor deposition system. The reactor of the low pressure chemical vapor deposition system is maintained at 1.8 torr, and the amorphous silicon is grown at 530 degrees in centigrade.

Figure 13:
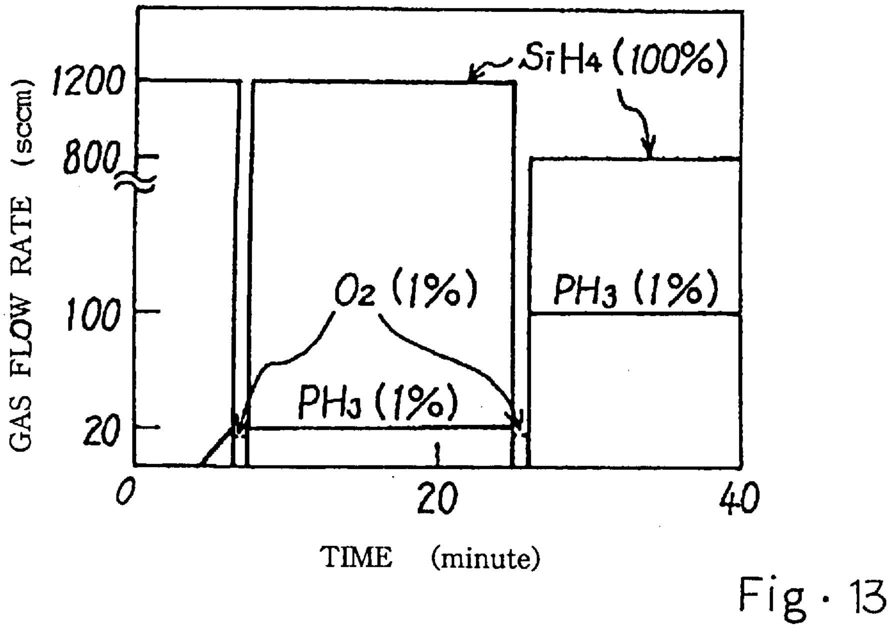
FIG. 13 is a graph showing gas flow rates during a deposition of the amorphous silicon layer.

FIG. 13 illustrates gas flow rates during the deposition of the amorphous silicon layer 23. First, only silane gas is introduced into the reactor for 3 to 4 minutes, and intentionally undoped amorphous silicon layer 23*a* is deposited to 10 nanometers thick over the gate oxide layer 22*a*. The phosphine gas is mixed into the silane gas, and is increased to 20 sccm at 5 sccm/min, and a first lightly phosphorous doped amorphous silicon layer 23*b* is deposited over the intentionally undoped amorphous silicon layer 23*a*.

When the flow rate of the phosphine gas reaches 20 sccm, the silane gas and the phosphine gas are stopped, and oxygen diluted in nitrogen at 1 percent is introduced into the reactor at 15 sccm, and the resultant semiconductor structure is exposed to the oxygen gas for 5 minutes. The oxygen is absorbed in a surface portion of the first lightly phosphorous doped amorphous silicon layer 23*b*, and a first absorbed layer 23*c* of 1 nanometer thick is formed on the first lightly phosphorous doped amorphous silicon layer 23*b*.

Subsequently, the silane gas and the phosphine gas are supplied to the reactor again at 1200 sccm and 20 sccm, respectively, and a second lightly phosphorous doped amorphous silicon layer 23*d* is grown for 20 minutes.

The silane gas and the phosphine gas are stopped again, and the oxygen gas is introduced into the reactor at 15 sccm for 5 minutes. A second absorbed layer 23*e* is formed on the second lightly phosphorous doped amorphous silicon layer 23*d*.

Figure 14:
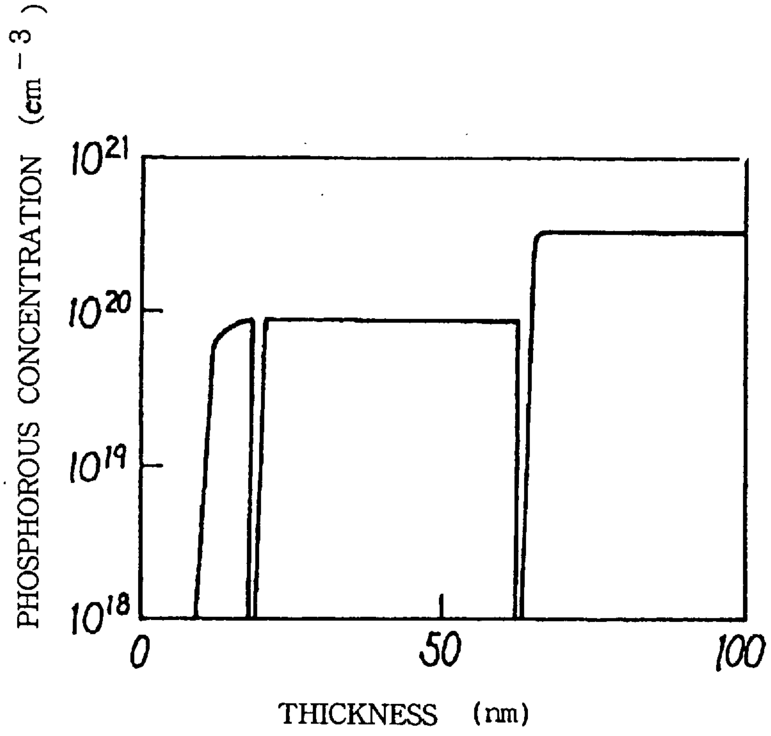
FIG. 14 is a graph showing a phosphorous concentration in the amorphous silicon layer.

Finally, the silane gas and the phosphine gas are introduced into the reactor at 800 sccm and 100 sccm, and a heavily phosphorous doped amorphous silicon layer 23*f* is grown on the second absorbed layer 23*e* for 15 minutes. The phosphorous concentration is varied as shown in FIG. 14.

Upon completion of the growth of amorphous silicon, tungsten silicide is deposited to 100 nanometers thick over the heavily phosphorous doped amorphous silicon layer 23*f* by using a sputtering, and a tungsten silicide layer 24 is laminated on the amorphous silicon layer 23.

A photo-resist etching mask (not shown) is prepared on the tungsten silicide layer 24, and the amorphous silicon layer 23 and the tungsten silicide layer 24 are patterned into a word line. A part of the word line on the gate oxide layer 22*a* serves as a gate electrode.

An insulating material is deposited over the word lines, and is reflowed. While heat is reflowing the insulating layer, the amorphous silicon layer 23 is crystallized, and is converted to a polysilicon layer. The insulating layer serves as a lower inter-level insulating layer.

A bit contact hole is formed in the lower inter-level insulating layer, and conductive material is deposited over the lower inter-level insulating layer. The conductive material fills the bit contact hole, and swells into a conductive layer. The conductive layer is patterned into bit lines.

An upper inter-level insulating layer is formed on the bit lines, and the crystallization proceeds during the reflow of the upper inter-level insulating layer. A node contact hole is formed in the upper inter-level insulating layer and the lower inter-level insulating layer, and conductive material is deposited over the upper inter-level insulating layer. The conductive layer is patterned into a storage node electrode, and the storage node electrode is covered with a dielectric film which in turn is covered with a cell plate electrode. The crystallization further proceeds during a heat treatment for the dielectric film.

Figure 15:
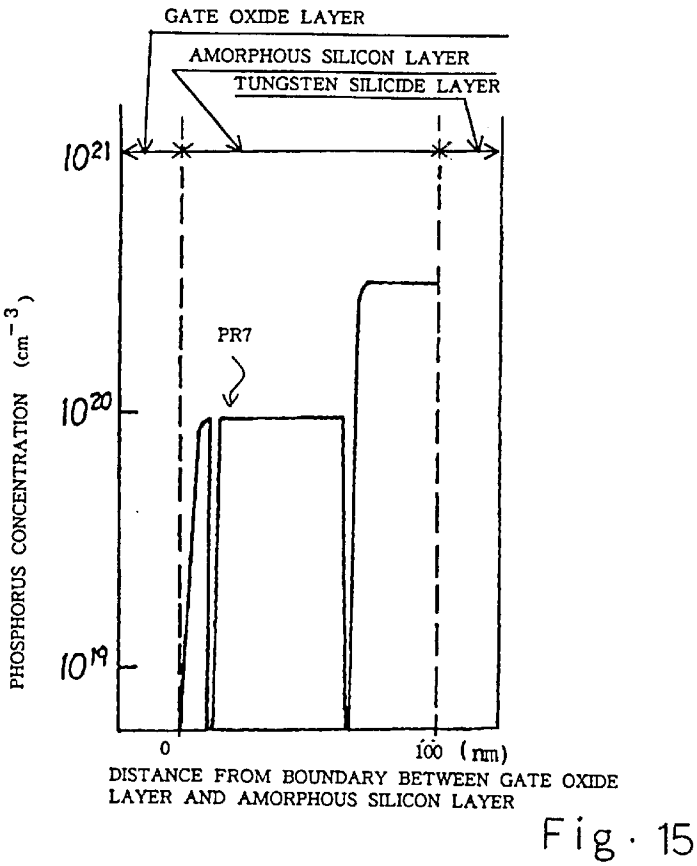
FIG. 15 is a graph showing an impurity profile in an amorphous silicon layer before a growth of an inter-level insulating layer.
Figure 16:
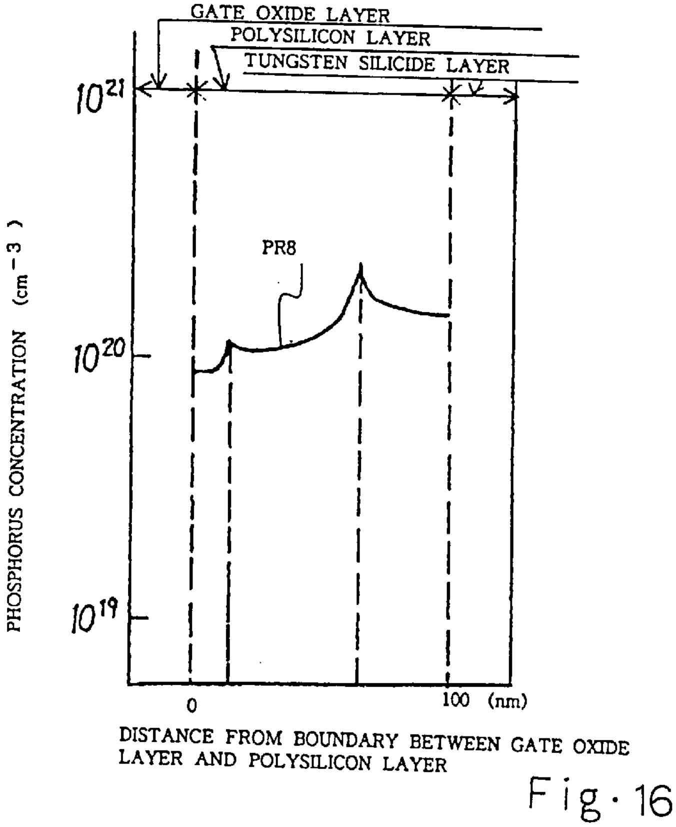
FIG. 16 is a graph showing an impurity profile in the amorphous silicon layer upon completion of a semiconductor dynamic random access memory device.

The present inventor measured the phosphorous concentration in the amorphous layer 23 and in the polysilicon layer, and plotted the phosphorous concentration in FIGS. 15 and 16. Upon completion of the growth of the amorphous silicon layer 23, the phosphorous concentration was represented by plots PR7, and was decreased to zero at the first and second absorbed layers 23*c*/23*e*. Upon completion of the semiconductor dynamic random access memory device, the phosphorous was segregated in the first and second absorbed layers 23*c*/23*e*, and the segregated phosphorous was drastically decreased at the boundary between the gate oxide layer 22*a* and the polysilicon layer. The present inventor thought that the first and second absorbed layers 23*c*/23*e* trapped the phosphorous diffused from the heavily phosphorous doped amorphous silicon layer 23*f*.

Figure 17:
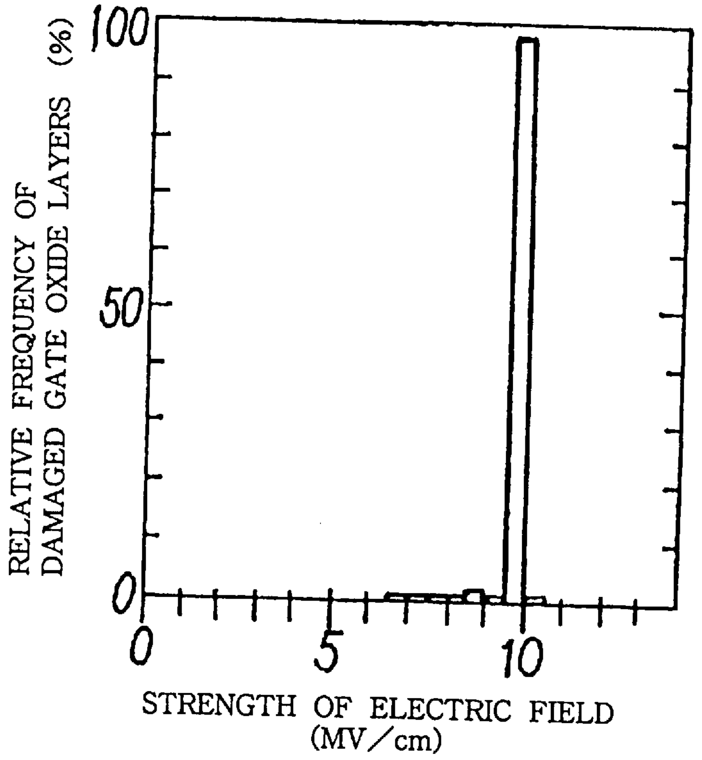
FIG. 17 is a graph showing a relative frequency of damaged gate oxide layer in terms of the strength of electric field.

The present inventor further evaluated the influence of the segregation. The present inventor increased the strength of electric field across the gate oxide layers, and measured leakage current flowing across the gate oxide layers. The relative frequency of damaged gate oxide layers was plotted in FIG. 17, and confirmed that the first and second absorbed layers 23*c*/23*e* were effective against the segregation of phosphorous.

The present inventor further confirmed that, although the first and second absorbed layers 23*c*/23*e* slightly increased the resistance of the gate electrode, the increment was negligible and no parasitic capacitor took place in the gate electrode. The first and second absorbed layers 23*c*/23*e* range from 0.5 nanometer thick to 2.0 nanometers thick.

Third Embodiment

Figure 18A:
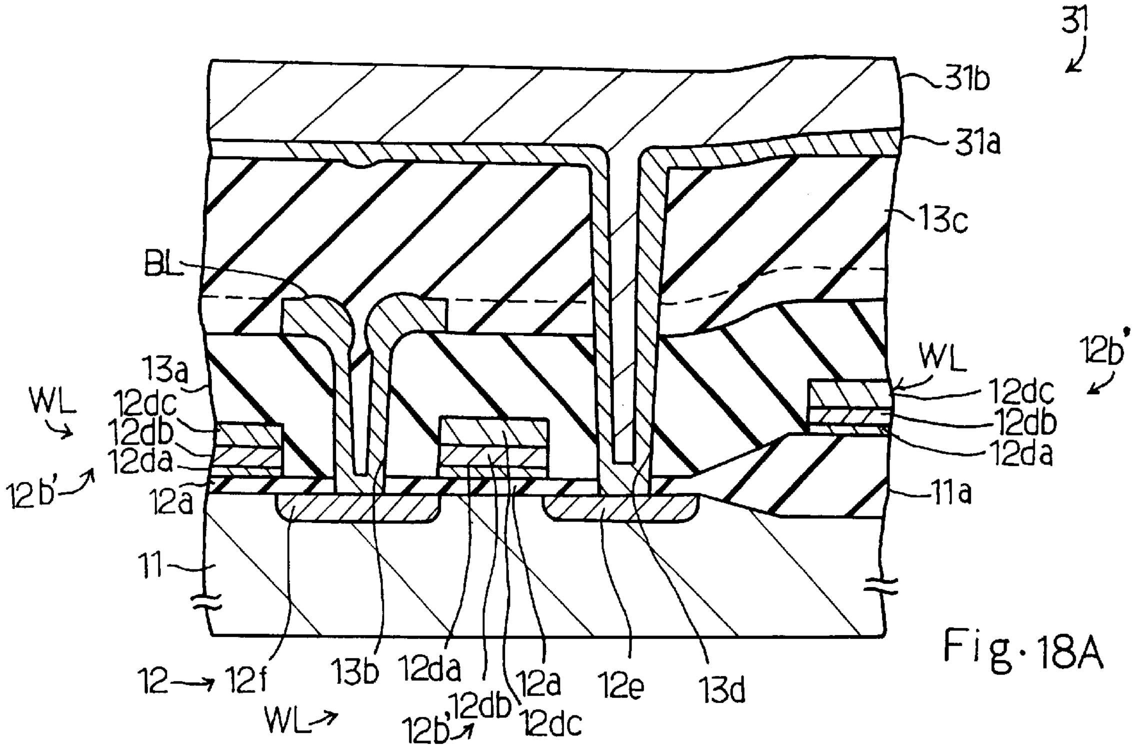
FIGS. 18A and 18B are cross sectional views showing essential steps of yet another process according to the present invention.
Figure 18B:
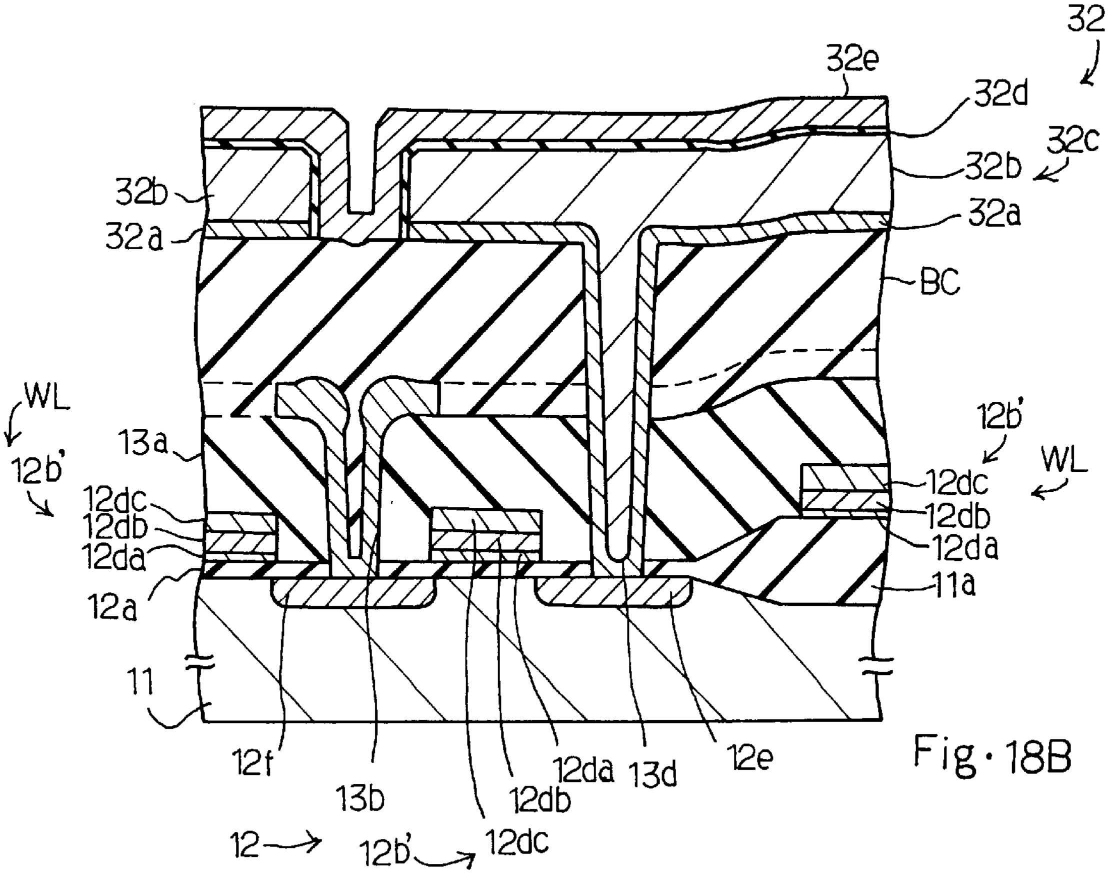

Yet another process embodying the present invention was described hereinbelow. The process implementing the third embodiment is similar to that of the first embodiment until the formation of the node contact hole 13*d*. For this reason, regions and layers of the semiconductor structure shown in FIGS. 18A and 18B are labeled with references designating corresponding regions and layers of the first embodiment without detailed description.

After the formation of the node contact hole 13*d*, the resultant semiconductor structure is placed in a reactor (not shown) of a low pressure chemical vapor deposition system, and an amorphous silicon layer 31 of 300 nanometers thick is deposited over the entire surface of the second inter-level insulating layer 13*c*.

Figure 19:
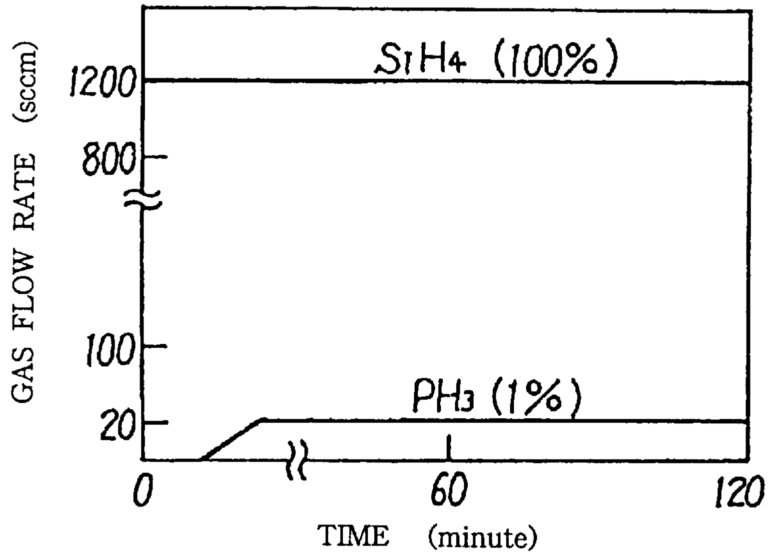
FIG. 19 is a graph showing flow rates during a deposition of an amorphous silicon layer.
Figure 20:
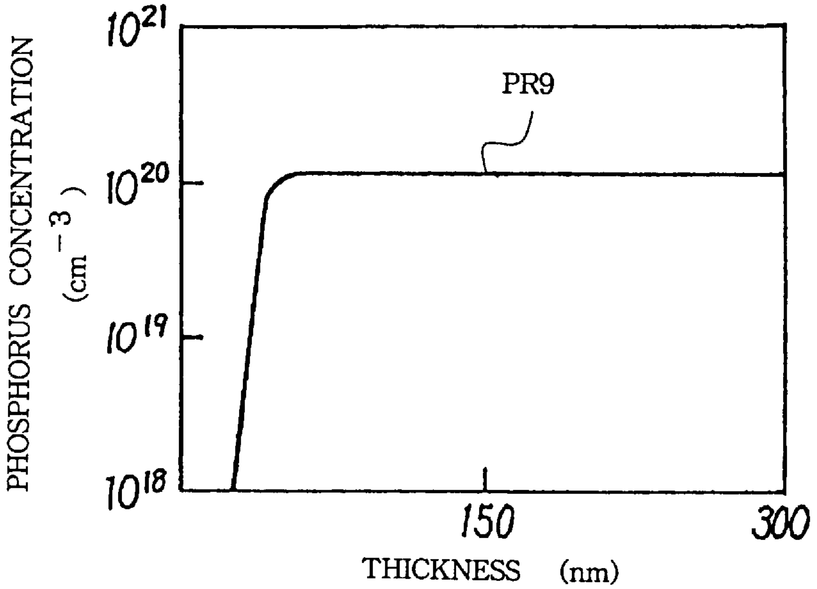
FIG. 20 is a graph showing a phosphorous concentration in the amorphous silicon layer.

FIG. 19 illustrates gas flow rates during the chemical vapor deposition. First, silane gas is introduced into the reactor at 1200 sccm for 5 minutes, and an intentionally undoped amorphous silicon layer 31*a* is topographically grown to 10 to 15 nanometers thick. The intentionally undoped amorphous silicon layer 31*a* defines a secondary node contact hole in the node contact hole 13*d*. Thereafter, the phosphine gas is gradually increased to 20 sccm, and is maintained at 20 sccm for 2 hours. Phosphorous-doped amorphous silicon fills the secondary node contact hole, and swells into a phosphorous-doped amorphous silicon layer 31*b* over the second inter-level insulating layer 13*c* as shown in FIG. 18A. The total thickness of the intentionally undoped amorphous silicon layer 31*a* and the phosphorous-doped amorphous silicon layer 31*b* is 300 nanometers. The dopant impurity is represented by plots PR9 of FIG. 20.

The resultant semiconductor structure is taken out from the reactor of the low-pressure chemical vapor deposition system, and is conveyed to a spin coater (not shown), by way of example. A photo-resist etching mask (not shown) is formed on the phosphorous-doped amorphous silicon layer 31*b*, and the amorphous silicon layer 31 is patterned into a storage node electrode 32. The storage node electrode 32 is implemented by the lamination of an intentionally undoped amorphous silicon strip and a phosphorous-doped amorphous silicon strip.

The resultant semiconductor structure is placed in the reactor of the low-pressure chemical vapor deposition system, and gaseous mixture of dichlorosilane and ammonia is introduced into the reactor. The gaseous mixture is maintained at 0.3 torr, and silicon nitride is deposited to 5 nanometers thick over the entire surface of the resultant semiconductor structure at 800 degrees in centigrade. While the silicon nitride is being deposited, the amorphous silicon layer 31 is crystallized, and the phosphorous is diffused from the phosphorous-doped amorphous/polysilicon strip toward the intentionally undoped amorphous/polysilicon strip. The storage node electrodes 32*c* is implemented by the lamination of polysilicon strips 32*a*/32*b*, and are covered with dielectric films 32*d*.

Finally, doped polysilicon is deposited to 150 nanometers thick over the dielectric films 32*d*, and a doped polysilicon layer is patterned into a cell plate electrode 32*e* as shown in FIG. 18B.

Figure 5:
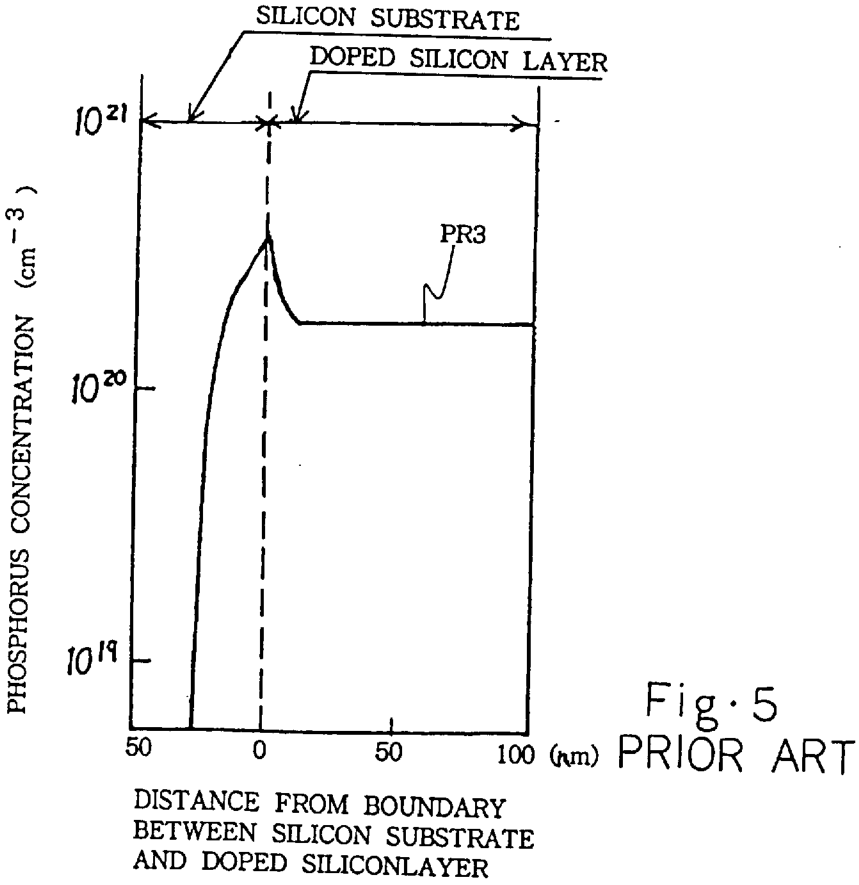
FIG. 5 is a graph showing the impurity profile around the contact between the impurity region and the doped polysilicon strip.
Figure 21:
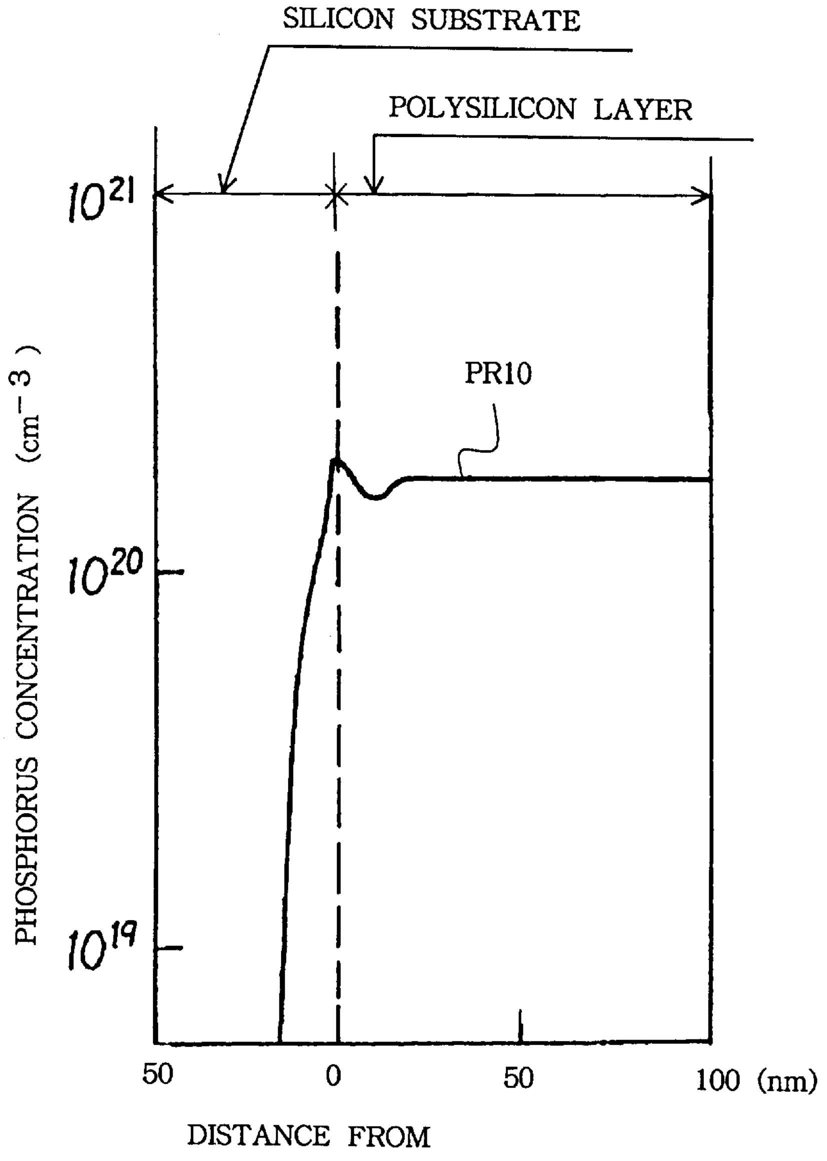
FIG. 21 is a graph showing an impurity profile across the boundary between a silicon substrate and a polysilicon after a heat treatment.

The present inventor measured the phosphorous concentration in the storage node electrode 32*c* upon completion of the semiconductor dynamic random access memory device, and the phosphorous concentration was plotted in FIG. 21. Comparing the impurity profile PR10 of FIG. 21 with the impurity profile PR3 of FIG. 5, it was understood that the intentionally undoped amorphous silicon layer effectively prevented the boundary with the silicon substrate 11 from segregation of phosphorous. Moreover, the diffusion range from the boundary was shorter than that of the prior art. Thus, the intentionally undoped amorphous silicon layer 31*a* restricts the out diffusion of phosphorous, and does not deteriorate the dynamic random access memory cell.

Figure 22:
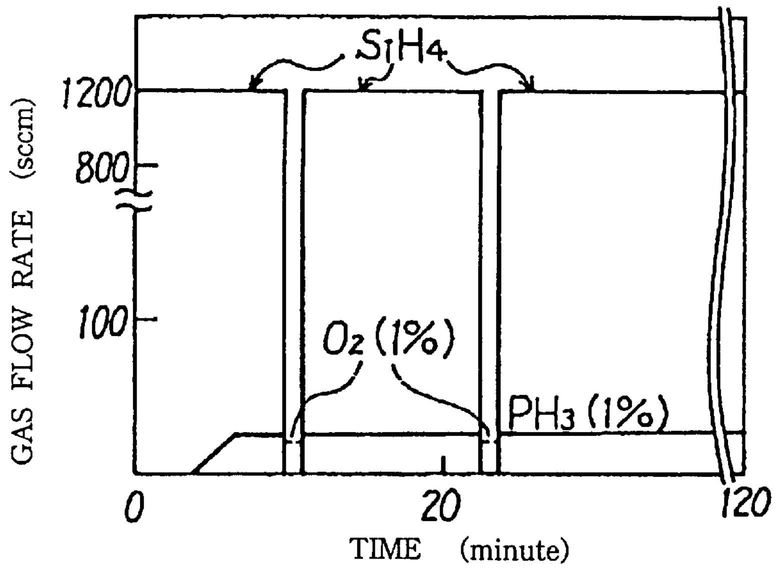
FIG. 22 is a graph showing flow rates of process gas for depositing an amorphous silicon layer.
Figure 23:
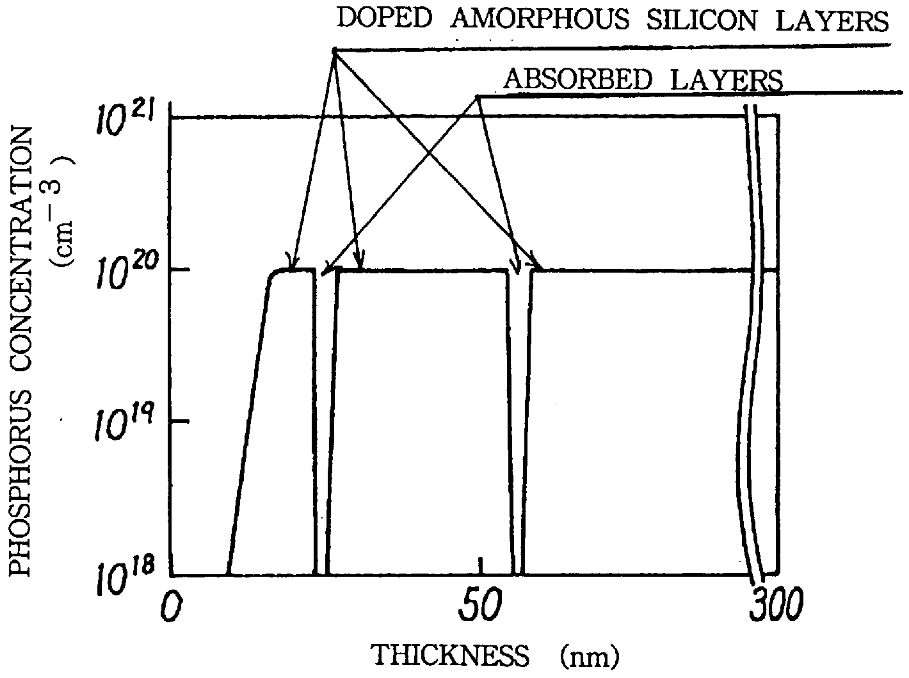
FIG. 23 is a graph showing an impurity profile of the amorphous silicon layer.

Absorbed layers may be formed in the phosphorous doped amorphous silicon layer 31*b*. In order to form the absorbed layers, the silane gas and the phosphine gas are intermittently stopped, and the oxygen gas is introduced into the reactor as shown in FIG. 22. Then, one or two absorbed layers are formed in the phosphorous-doped amorphous silicon layer 31*b* around 10 to 50 nanometers spaced from the boundary between the intentionally undoped amorphous silicon layer 31*a* and the phosphorous doped amorphous silicon layer 31*b*. The phosphorous concentration of the amorphous silicon layer 31 is shown in FIG. 23. The present inventor confirmed that the absorbed layers were effective against the diffusion of the phosphorous.

Although particular embodiments of the present invention have been shown and described, it will be obvious to those skilled in the art that various changes and modifications may be made without departing from the spirit and scope of the present invention.

For example, an intentionally undoped amorphous silicon strip, a lightly phosphorous doped amorphous silicon strip, a heavily phosphorous doped amorphous silicon strip and a refractory metal silicide strip may be converted to a lamination of a polysilicon strip and the refractory metal silicide strip during a reflow of an inter-level insulating layer.

The present invention is applicable to a bit line and other signal wirings.

The dopant impurity is never limited to phosphorous. A doped polysilicon may contain arsenic, antimony, boron or another p-type dopant impurity. The refractory metal silicide may be titanium silicide, molybdenum silicide etc.

What is claimed is:

1. A process of fabricating a semiconductor device, comprising the steps of:

a) forming an insulating layer;

b) forming an intentionally undoped amorphous silicon layer on said insulating layer;

c) forming a doped amorphous silicon layer containing a dopant impurity over said intentionally undoped amorphous silicon layer;

d) forming an absorbed layer in said doped amorphous silicon layer; and e) heating said intentionally undoped amorphous silicon layer and said doped amorphous silicon layer so as to crystallize said intentionally undoped amorphous silicon layer and said doped amorphous silicon layer.

2. The process as set forth in claim 1, in which said doped amorphous silicon layer has a lightly doped amorphous silicon layer formed on said intentionally undoped amorphous silicon layer and a heavily doped amorphous silicon layer formed on said lightly doped amorphous silicon layer and said absorbed layer is formed on said lightly doped amorphous silicon layer.

3. The process as set forth in claim 2, in which said lightly doped amorphous silicon layer and said heavily doped amorphous silicon layer have a dopant concentration of $0.8\times10^{20}$ $cm^{-3}$ and a dopant concentration of $3\times10^{20}$ $cm^{-3}$, respectively.

4. The process as set forth in claim 2, further comprising the steps of c') forming a refractory metal silicide layer on said heavily doped amorphous silicon layer after said step c), and c") patterning the lamination of said intentionally undoped amorphous silicon layer, said lightly doped amorphous silicon layer, said heavily doped amorphous silicon layer and said refractory metal silicide layer into a gate electrode of a field effect transistor before said step e).

5. The process as set forth in claim 4, in which said lightly doped amorphous silicon layer, said heavily doped amorphous silicon layer and said refractory metal silicide layer patterned into said gate electrode are heated during a reflow step for an inter-level insulating layer covering said gate electrode.

6. The process as set forth in claim 2, wherein said forming step e) comprises:

b') exposing a surface portion of said lightly doped amorphous silicon layer to oxygen.

7. The process as set forth in claim 6, in which said absorbed layer ranges between 0.5 nanometers thick to 2.0 nanometers thick.

8. The process as set forth in claim 6, further comprising the steps of c') forming a refractory metal silicide layer on said heavily doped amorphous silicon layer after said step c), and c") patterning the lamination of said intentionally undoped amorphous silicon layer, said lightly doped amorphous silicon layer, said absorbed layer, said heavily doped amorphous silicon layer and said refractory metal silicide layer into a gate electrode of a field effect transistor before said step e).

9. The process as set forth in claim 1, in which said insulating layer has a contact hole open to an impurity region of a first conductivity type formed in a semiconductor substrate of a second conductivity type opposite to said first conductivity type, and said intentionally undoped amorphous silicon layer is held in contact with said impurity region exposed to said contact hole.

* * * * *